(12) United States Patent
Ueno

(10) Patent No.: US 7,455,533 B2
(45) Date of Patent: Nov. 25, 2008

(54) METHOD FOR PRODUCING PRINTED WIRING BOARD

(75) Inventor: Yukihiro Ueno, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 130 days.

(21) Appl. No.: 11/280,357

(22) Filed: Nov. 17, 2005

(65) Prior Publication Data

US 2006/0108145 A1    May 25, 2006

(30) Foreign Application Priority Data

Nov. 19, 2004   (JP) .............................. 2004-336145

(51) Int. Cl.
*H01R 4/58* (2006.01)

(52) U.S. Cl. .......................... 439/91; 361/792; 174/257

(58) Field of Classification Search .................. 439/55, 439/66, 69, 91; 174/250, 257, 259; 361/792; 29/829–831

See application file for complete search history.

(56) References Cited

U.S. PATENT DOCUMENTS

| | | | |
|---|---|---|---|
| 3,391,455 A * | 7/1968 | Hirohata et al. ................ 29/852 |
| 5,545,466 A * | 8/1996 | Saida et al. .................. 428/209 |
| 5,807,763 A * | 9/1998 | Motika et al. ................. 438/18 |
| 6,256,874 B1 * | 7/2001 | Appelt et al. ................. 29/830 |
| 6,300,575 B1 * | 10/2001 | Appelt et al. ................ 174/256 |
| 6,739,046 B1 * | 5/2004 | Appelt et al. ................. 29/846 |
| 6,834,426 B1 * | 12/2004 | Japp et al. .................... 29/830 |
| 6,893,742 B2 * | 5/2005 | Chen et al. .................. 428/675 |

FOREIGN PATENT DOCUMENTS

| | | |
|---|---|---|
| JP | 57-34356 A | 2/1982 |
| JP | 1-198092 A | 8/1989 |
| JP | 5-75233 A | 3/1993 |
| JP | 6-169168 A | 6/1994 |
| JP | 7-202367 A | 8/1995 |
| JP | 7-231152 A | 8/1995 |
| JP | 8-236930 A | 9/1996 |
| JP | 2003-163451 A | 6/2003 |
| JP | 2003-298264 A | 10/2003 |

* cited by examiner

*Primary Examiner*—Khiem Nguyen
(74) *Attorney, Agent, or Firm*—Birch, Stewart, Kolasch & Birch, LLP

(57) ABSTRACT

An insulating resin layer 50 is formed on a surface of a conductor portion 2 by performing a plating pretreatment to the conductor portion 2 that has been formed on a surface of a wiring board substrate 1, and forming numerous dendrites 3 on the surface of the conductor portion 2 using an electroplating or chemical plating method. The insulating resin layer 50 is then formed by stacking an insulating resin plate 50 that has a semi-cured adhesive layer 40 formed thereon in advance on the conductor portion 2 and the dendrites 3, and then applying pressure and raising temperature for laminate bonding.

14 Claims, 6 Drawing Sheets

METHOD FOR PRODUCING PRINTED WIRING BOARD

BACKGROUND OF THE INVENTION

This application claims priority under 35 U.S.C. § 119(a) on Patent Application No. 2004-336145 filed in Japan on Nov. 11, 2004, the entire contents of which are hereby incorporated by reference.

The present invention relates to a method for producing a printed wiring board.

In general, a printed wiring board is produced after undergoing many processes for laminating and bonding a conductor layer and an insulating layer. In these production processes, it is a very important factor to secure the bond strength by improving the contact performance between layers of a printed wiring board.

For example, in a multilayer wiring board, an insufficient bond strength between an interlayer insulating layer and a conductor metal layer can break the wiring board or disconnect the circuits, which can lead to malfunction of an electronic device that has the wiring board mounted thereon, because the layers may separate from one another when a temperature stress or a bend stress is applied to the wiring board. It is also known, especially with a printed wiring board that has flexibility, such as flexible wiring board and flex-rigid wiring board, that the contact property and the bond performance between a conductor layer and the insulating layers that are placed above and below it not only cause a problem of blisters due to temperature and moisture stresses but also affect the bend performance of the same.

For these reasons, various measures have been proposed to improve the bond performance between layers, among other things, the bond performance in bonding different materials, such as the bond performance between a conductor layer and an insulating resin layer and the bond performance between a conductor layer and a cover lay layer.

The examples include a blackening treatment and a browning treatment in which the surface of a conductor layer is coated with an oxide film. In addition, a method for a surface roughening treatment in which a conductor metal is dissolved using a chemical prior to bonding of each of the layers so that its surface becomes rough has also been proposed. Furthermore, such methods as a polishing method in which the surface of a conductor is mechanically polished to add projections and depressions so that the bonding area becomes larger with the bare metal surface exposed, and a laser abrasion method in which the surface of a conductor is scanned with a laser beam to clean the surface of the conductor and improve the reactivity have yet also been proposed and actually been utilized. In addition, a method for treating the bonding surface with plasma has yet also been proposed as disclosed in JP 2003-163451.

As mentioned above, various methods have been proposed for improvement of the contact property and the bond strength between layers of a printed wiring board. In reality, however, they do not always result in improvement in the contact property and the bond property between the layers. They have a great impact on the bend performance especially of a flexible wiring board whose features include the use while it is bent. Since a flexible wiring board is made by bonding polyimide that is difficult to bond and a copper film, there is a reality in which the above mentioned methods may not always be able to secure a sufficient bond strength between the cover lay and the conductor pattern at the portion bended as mentioned above.

Given these factors, the applicant of the present invention focused attention on forming numerous protruding metal crystals on the surface of a conductor portion and utilizing them to secure the superior contact property and bond strength, which were impossible to achieve with the above mentioned techniques.

One example of such a projecting metal crystal is a dendrite. A method for forming this dendrite has been disclosed, for example, in JP S57-34356A and in JP 2003-298264A. In addition, an application example of a dendrite as mentioned above is disclosed in JP H1-198092A. In this example, a dendrite is utilized as an anisotropic connector, and this example has a configuration in which a dendrite is formed on a conductor pattern and it is then filled with a resin. In order to secure the conductivity between layers through this dendrite, the tip of the dendrite is exposed to the surface of a bonding layer.

In addition, in JP H7-231152A, a method for improving the contact property between layers by providing bumps on the surface of a conductor is proposed. This method is to form a rough surface for a bonding layer simply by forming very fine bumps in the shape of an inverted teardrop.

In addition, in JP H5-75233, a method for preventing a line disconnection or a line lifting by forming copper oxide and then forming a resist image on the surface through reduction of the same to copper is proposed. In addition, in JP H6-169168A, JP H7-202367A, and JP H8-236930A, a method for attempting to improve the bond strength by providing projections on the surface of a conductor is described, but the intention there is rather to inhibit generation and development of dendrites.

SUMMARY OF THE INVENTION

The present invention is carried out in view of the above-described problems, and has an object of providing a method for producing a printed wiring board having superiority in all of the reliability, durability, and product stability by drastically improving the contact performance and the bond strength between an interlayer insulating layer and a conductor layer without reducing the bend performance through active formation and utilization of projecting metal crystals on the surface of a conductor portion.

For solving the problems described above, a method for producing a printed wiring board according to the present invention, includes a step of performing a plating pretreatment to a conductor portion that has been formed on a surface of a wiring board substrate, a step of forming numerous projecting metal crystals on the surface of the conductor portion using an electrical or chemical method, and a step of forming an insulating resin layer on the surface of the conductor portion that has the projecting metal crystals formed thereon, wherein the insulating resin layer is formed by laminate bonding an insulating resin plate to the surface of the conductor portion using an adhesive.

According to this configuration, the bond area can be increased by forming the projecting metal crystals on the surface of the conductor portion that will be bonded to the insulating resin layer, and applying the adhesive to the projecting metal crystals, and the bond strength between the insulating resin layer and the conductor portion can be improved by forming a matrix during the application.

It is preferable to form the projecting metal crystals in the form of branches or needles. The projecting metal crystals may be dendrites that are formed using an electroplating or chemical plating method.

Projecting metal crystals are considered to be problematic in a conventional plating process for producing a printed wiring board such as panel plating, and inhibition of their generation has been of the highest importance. The present invention, on the contrary, attempts to actively utilize projecting metal crystals. Projecting metal crystals that are formed in a branch or needle-like shape can increase the bond area and form a matrix when an adhesive is applied, and thus make it possible to improve the bond strength between layers.

The step of forming the projecting metal crystals may be performed such that a plating resist that has numerous minute holes is formed on the surface of the conductor portion, and the plating resist is removed (stripped off) after forming the projecting metal crystals that are grown from the minute holes in such a manner that their tip portions become thicker than their center portions and base portions.

According to this configuration, formation of the projecting metal crystals in such a shape makes it easier to control and manage the process of forming the projecting metal crystals, and thereby the productivity can be improved.

In principle, a metal used for forming the projecting metal crystals described above may be any metal, but in view of ease of plating and the contact property between the conductor portion and the adhesive used for bonding the insulating resin plate thereon, formation using copper, tin, or nickel is preferable.

In addition, prior to the step of forming an insulating resin layer, an oxidation treatment may be performed to the surface of the projecting metal crystals. This configuration makes it possible to secure a good wettability between the projecting metal crystals and the adhesive that is filled and applied to the same, and thereby the bond property and the contact property can be improved.

In a method for producing a printed wiring board according to the present invention, it is preferable that the insulating resin layer is formed by forming a semi-cured adhesive layer in advance on a surface of an insulating resin plate, stacking the insulating resin plate on the conductor portion and the projecting metal crystals, and then applying pressure and raising temperature for laminate bonding.

Unlike conventional techniques, such a configuration forms a matrix in which the projecting metal crystals and the adhesive layer of the insulating resin plate become complicatedly intricate, and thus a good bond property and contact property can be expected because the entire adhesive layer in a matrix state increases the bond strength.

In addition, the insulating resin layer may be formed by applying a liquid adhesive to the surface of the wiring board substrate and filling in gaps between the projecting metal crystals, semi-curing or drying the adhesive, then stacking an insulating resin plate provided with an adhesive layer or a semi-cured insulating resin plate, and then applying pressure and raising temperature for laminate bonding.

Such a configuration makes it easier to maintain and control the flowability of an adhesive, and thus preferable adhesive flow into the gaps between the projecting metal crystals can be secured. Accordingly, the bond property and the contact property between the conductor portion and the insulating resin layer can be further improved.

In addition, in a method for producing a printed wiring board according to the present invention, prior to the step of forming an insulation resin layer, the projecting metal crystals may be crushed by applying pressure using appropriate means for pressing. As the means for pressing, for example, roller, pressing plate, or the like are preferable, but any means that can crush a predetermined amount of the projecting metal crystals formed by applying pressure is acceptable. By performing this step, a metal layer that has numerous fine air gaps can be formed on the surface of the conductor portion through creation of a state in which the projecting metal crystals become entangled with one another in a complex way while securing air gaps between the projecting metal crystals, and thus the bond strength can be improved.

In addition, in the method for producing a printed wiring board as described above, after applying and filling a liquid adhesive, the projecting metal crystals may be crushed using appropriate means for pressing at the time when the adhesive is either in a liquid state, in a semi-cured state, or in a cured state. Furthermore, the projecting metal crystals may yet as well be crushed by applying pressure to the insulating resin layer after formation of the insulating resin layer.

Such a configuration, in which a metal layer that has projecting metal crystals in a complicatedly intricate state and numerous fine air gaps is formed on the surface of the conductor portion, and an adhesive is applied so that the adhesive completely fill the metal layer without creating air bubbles, also makes it possible to further increase the bond strength.

In a method for producing a printed wiring board having the configuration described above, the contact performance and the bond strength between the conductor portion and the insulating resin layer can be drastically improved by actively utilizing the projecting metal crystals formed on the surface of the conductor portion, and thereby the printed wiring board can have superiority in all of the reliability, durability, and product stability without deteriorating the bend performance.

DESCRIPTION OF THE PREFERRED EMBODIMENTS

Hereinafter, embodiments of a method for producing a printed wiring board according to the present invention will be described with reference to the accompanying drawings.

A method for producing a printed wiring board according to the present invention includes a step of performing a plating pretreatment on a conductor portion that has been formed on the surface of a wiring board substrate, a step of forming numerous projecting metal crystals on the surface of the conductor portion using an electrical or chemical method, and a step of forming an insulating resin layer on the surface of the conductor portion that has the projecting metal crystals formed thereon. And, this insulating resin layer is formed by laminate bonding an insulating resin plate to the surface of the conductor portion with an adhesive.

Incidentally, the following embodiments are embodiment examples of the present invention in a step of attaching a cover lay onto a conductor layer of an one-sided flexible wiring board, and do not limit the technical scope of the present invention.

Herein mentioned laminate bonding of a printed wiring board is, in principle, bonding of a conductor metal and an insulating layer, which are single layers, through an adhesive, or bonding of a prepreg that can serve both as a conductor metal and an insulating layer, and each of the following embodiments can be applied to any wiring board, from one-sided to highly multilayered, such as hard substrate, flexible substrate and substrate having both a hard portion and a flexible portion, by replacing the materials and the relationship of vertical stacking of materials.

Embodiment 1

Figure 1:
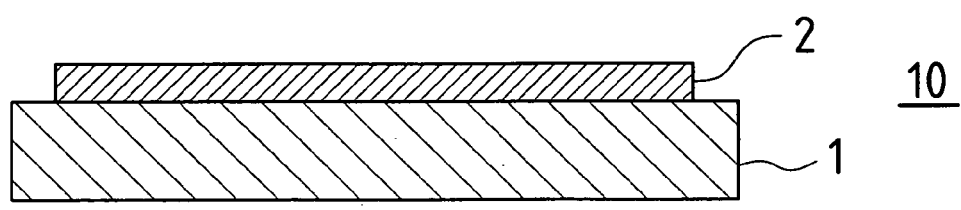
FIG. 1 is a schematic cross-sectional view that shows a process of production in a method for producing a printed wiring board according to Embodiment 1 of the present invention.
Figure 2:
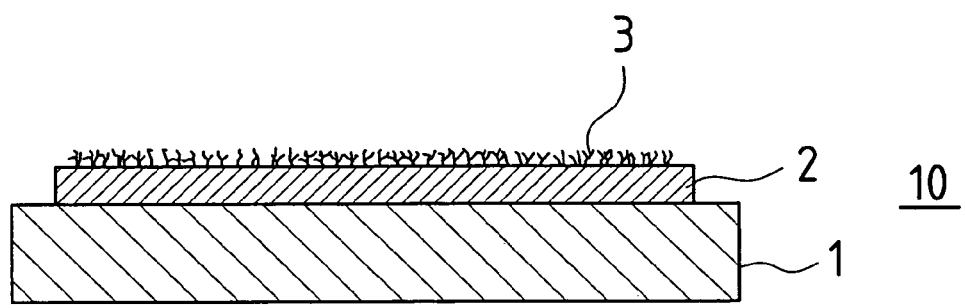
FIG. 2 is a schematic cross-sectional view that shows a process of production according to Embodiment 1 of the present invention.
Figure 3:
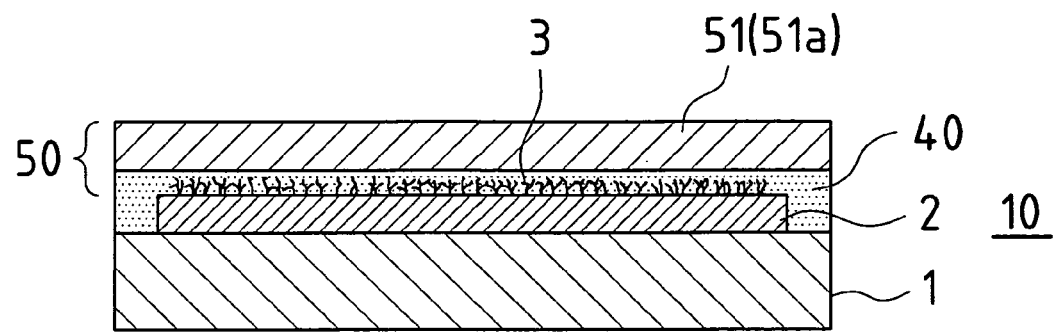
FIG. 3 is a schematic cross-sectional view that shows a process of production according to Embodiment 1 of the present invention.

FIGS. 1 to 3 are schematic cross-sectional views of an enlarged conductor portion of a printed wiring board according to Embodiment 1 of the present invention.

A printed wiring board 10 is a flexible wiring board that has a conductor pattern formed as a conductor portion 2 (not shown) on one side (the side that becomes an outer side after laminating) of a wiring board substrate 1 that is made of a polyimide or polyester film. The conductor pattern on the wiring board substrate 1 is formed with a copper film. Although it is not shown in FIG. 1, an adhesive layer may be provided between a conductor of the conductor pattern and the wiring board substrate 1. First, an appropriate plating pretreatment is performed on the surface of the conductor of the conductor pattern of the wiring board substrate 1.

Next, projecting metal crystals are formed on the surface of the above mentioned conductor portion 2 using an electroplating method or a chemical plating method. In this embodiment, branched or needle-like dendrites 3 are formed as the projecting metal crystals on the entire surface of the conductor portion 2. The process for forming the dendrites 3 through plating can be performed in the same manner as a conventional electroplating method or a chemical plating method.

In principle, a metal used to form the dendrites 3 may be any metal, but in view of ease of plating and the contact property of an adhesive layer 40 to which the conductor pattern, a cover lay material 51a, which will be described later, and others are bonded, the use of copper, tin, or nickel is especially preferable.

It is preferable to form the branched or needle-like dendrites 3 to have a smaller height than the conductor pattern, more specifically to have a size in an approximate range of several μm to tens of μm.

Then, the wiring board substrate 1 that has undergone the above mentioned steps is cleaned so that broken portions of the dendrites 3 are removed from the surface of the conductor portion 2, and the cover lay material 51a is temporarily fixed. As the cover lay material 51a, a plate material that has the semi-cured adhesive layer 40 formed thereon by applying in advance an adhesive to a polyimide film, polyester film, or the like serving as an insulating resin layer 51 is used.

Subsequently, the above mentioned cover lay material 51a that has been temporarily fixed is heat pressed so as to be bonded to the wiring board substrate 1. In performing this, a relatively low pressure in the range that does not completely crush the dendrites 3 and a low temperature in the range that can secure flowability of the cover lay material 51a are temporarily maintained for a predetermined period of time. The cover lay material 51a is then laminate bonded by increasing the pressure and the temperature to the necessary level for complete bonding.

Thus, the adhesive of the cover lay material 51a flows into the spaces between the numerous dendrites 3 that have been formed on the surface of the conductor portion 2 to fill the gaps, and is cured, and can provide a high bond strength. FIG. 3 shows a state in which the cover lay material 51a has been bonded. As shown in FIG. 3, the dendrites 3 penetrate through the adhesive layer 40 and an integrated insulating resin layer 50 can be formed in which a matrix is formed, and thus the bond property and the contact property between the conductor portion 2 and the insulating resin layer 50 can be improved.

If the temperature or pressure is inappropriately controlled during the heat pressing of the cover lay material 51a, the dendrites 3 may be completely crushed before a sufficient flow of the adhesive of the cover lay material 51a is obtained, or the adhesive may not completely flow into the spaces between each of the dendrites 3. This may prevents formation of a matrix of the metal and the adhesive, and may form an air gap in the adhesive layer 40, which may result in inability to obtain the intended bond strength and occurrence of swelling during heating. Accordingly, it is preferable to laminate bond the cover lay material 51a so that the adhesive of the cover lay material 51a completely fills the spaces between the dendrites 3.

When applying a method of production according to the present invention to a printed wiring board that has a through-hole, a via hole, or the like, if the dendrites 3 are formed on the inner wall of the through-hole or the via hole, the dendrites 3 may become broken or drop while in a subsequent handling, and a circuit disconnection may result, or the surface may be oxidized so that solderability is inhibited. For this reason, as to a printed wiring board that has a through-hole, a via hole, or the like, it is preferable that the through-hole, the via hole, or the like is masked prior to formation of the dendrites 3 to prevent plating attachment.

Embodiment 2

Figure 4:
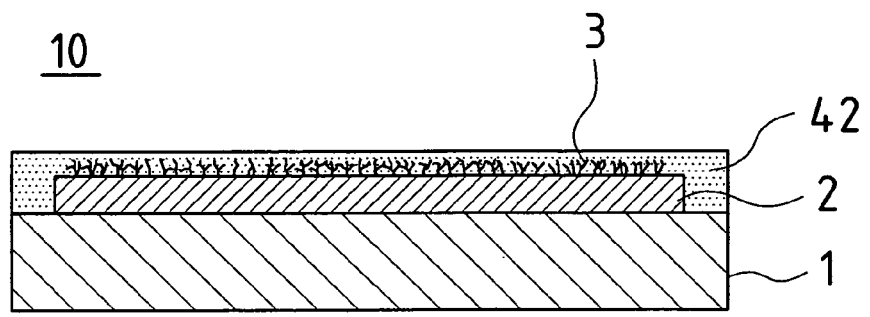
FIG. 4 is a schematic cross-sectional view that shows a process of production in a method for producing a printed wiring board according to Embodiment 2 of the present invention.
Figure 5:
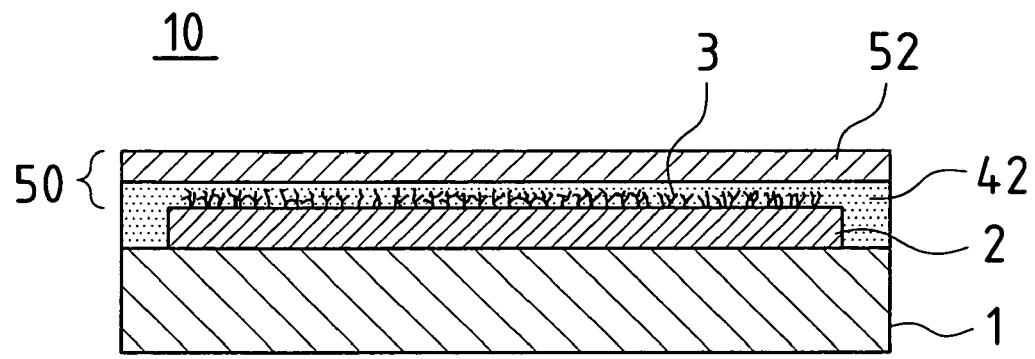
FIG. 5 is a schematic cross-sectional view that shows a process of production according to Embodiment 2 of the present invention.

Hereafter, Embodiment 2 of the present invention will be described. FIGS. 4 and 5 are schematic cross-sectional views that show Embodiment 2 according to the present invention. In each explanation of a method for producing a printed wiring board according to Embodiments 2 to 6, the detailed explanations are omitted by using the same numeric references for the portion that has the same configuration as Embodiment 1.

As shown in FIG. 4, in Embodiment 2, numerous dendrites 3 are formed on a conductor pattern 2, and, subsequently, an adhesive 42 in a flowing liquid state is applied onto the wiring board substrate 1 and filled into the spaces between the dendrites 3. In this embodiment, a denatured acrylic adhesive is used as the adhesive 42.

The adhesive 42 may be applied in a method as required by the properties of the adhesive used, such as in a roll coating method, a spray method and a printing method, and is applied and filled so that the spaces between the dendrites 3 are completely filled without leaving any air bubbles.

Subsequent to the application and filling of the adhesive 42 as described above, the adhesive 42 is semi-cured or dried while in a state shown in FIG. 4. Then, as shown in FIG. 5, an insulating resin plate 52 is temporarily fixed thereon, and necessary heat and pressure are applied so that curing and bonding are achieved. In this embodiment, a polyimide film is used as the insulating resin plate 52. By performing this step, the insulating resin layer 50 is formed.

According to a method for producing the printed wiring board 10 that has such a configuration, compared to Embodiment 1, it becomes relatively easier to control pressurization and rise in temperature at the time of formation of an insulation resin layer 50 by utilizing the liquid adhesive 42. In other words, compared to the example described in Embodiment 1 in which the cover lay material 51a is used for forming an insulating resin layer, it is easier to maintain and control the flowability of the adhesive 42, and is easier to secure the flow of the adhesive 42 into the spaces between the dendrites 3.

Embodiment 3

Figure 6:
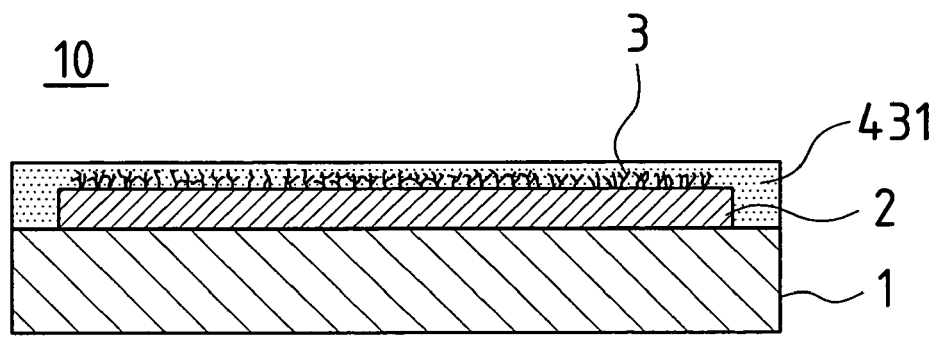
FIG. 6 is a schematic cross-sectional view that shows a process of production in a method for producing a printed wiring board according to Embodiment 3 of the present invention.
Figure 7:
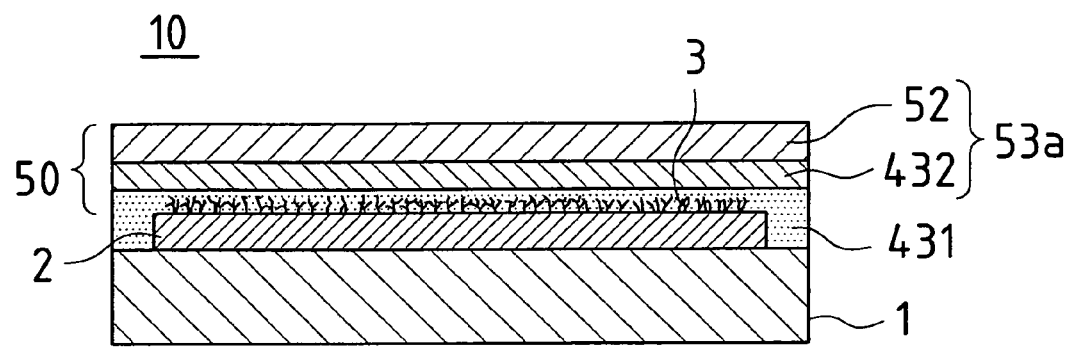
FIG. 7 is a schematic cross-sectional view that shows a process of production according to Embodiment 3 of the present invention.

Hereafter, Embodiment 3 of the present invention will be described. FIGS. 6 and 7 are schematic cross-sectional views that show Embodiment 3 of the present invention. This embodiment may be interpreted as a combination of Embodiments 1 and 2 described above.

FIG. 6 shows a state in which numerous dendrites 3 have been formed on the surface of a conductor portion 2 and a liquid adhesive 431 has been applied thereon in the same manner as in Embodiments 1 and 2.

An insulating resin layer 50 is then formed. In the illustrated example, the insulating resin layer 50 is formed by laminate bonding a cover lay material 53a that has an adhesive layer in a semi-cured state formed thereon by applying in advance an adhesive 432 to a polyimide film, polyester film, or the like serving as an insulating resin plate 52.

Next, as shown in FIG. 7, after the adhesive 431 that has been applied onto a wiring board substrate 1 and filled into the dendrites 3 becomes semi-cured or dry, the cover lay material 53a is temporarily fixed, and the cover lay material 53a is laminate bonded by applying heat and pressure.

At this point, instead of the cover lay material 53a that has an adhesive layer as described above, a semi-cured insulating resin plate made of a resin with a good bond property may be stacked on the dendrites 3 of the wiring board substrate 1, and the same action can be expected. In this case, the insulating resin layer 50 is formed by drying, semi-curing, or completely curing the insulating resin plate that has been stacked instead of the cover lay material 53a, and then laminate bonding by applying heat and pressure.

According to a method for producing a printed wiring board 10 that has such a configuration, the bond strength of the adhesive 431 on the surface of the conductor portion 2 and the adhesive 432 of the cover lay material 53a makes it possible to further improve the contact property and the bond property between the conductor portion 2 and the insulating resin layer 50.

Embodiment 4

Figure 8:
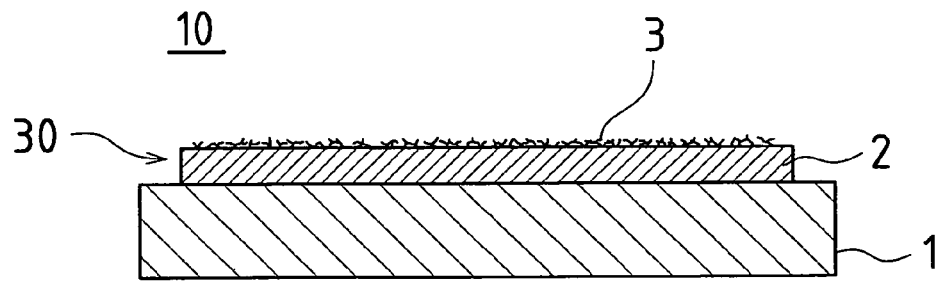
FIG. 8 is a schematic cross-sectional view that shows a process of production in a method for producing a printed wiring board according to Embodiment 4 of the present invention.
Figure 9:
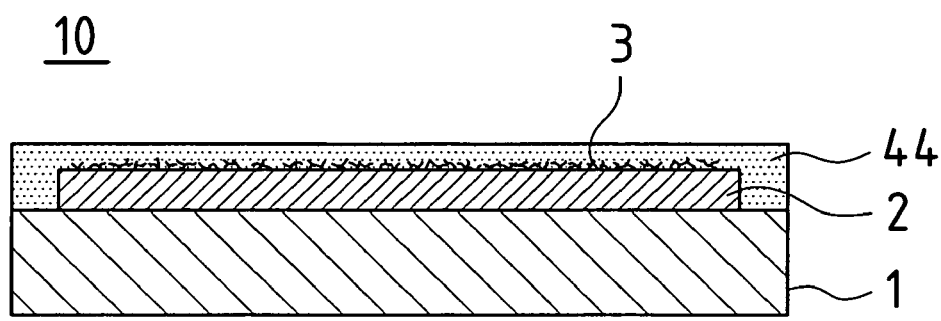
FIG. 9 is a schematic cross-sectional view that shows a process of production according to Embodiment 4 of the present invention.

Hereafter, Embodiment 4 of the present invention will be described. FIGS. 8 and 9 are schematic cross-sectional views that show Embodiment 4 of the present invention.

In Embodiments 1 to 3, the dendrites 3 that have been formed on the surface of the conductor portion 2 are left as they are when the subsequent step of forming the insulating resin layer 50 is performed. In reality, it is preferable to perform a treatment to secure a sufficient strength of the dendrites 3 because the dendrites 3, when left as they are deposited, have fine branches formed with directional shapes.

For this reason, in this embodiment, prior to a step of forming the insulating resin layer 50, the dendrites 3 that have been formed on the conductor portion 2 are crushed to a predetermined amount from the surface of the conductor portion 2 using means for pressing. As the means for pressing, for example, roller, pressing plate, or the like are preferable, but any means that can crush the numerous dendrites 3 by applying pressure is acceptable.

As shown in FIG. 8, by crushing a predetermined amount of the dendrites 3, the dendrites 3 become entangled with one another in a complex way while securing air gaps between the dendrites 3. By performing this step, a metal layer 30 that has numerous fine air gaps can be formed on the surface of the conductor portion 2.

After this, when the insulating resin layer 50 is formed using any one of the methods shown in the above mentioned Embodiments 1 to 3, a matrix in which an adhesive 44 and the dendrites 3 become complicatedly intricate is formed, which can greatly improve the bond strength.

According to a method for producing a printed wiring board 10 that has such a configuration, since a process is performed in which the dendrites 3 are crushed in advance using a means for pressing, it is significantly easier to control the pressure at the time of formation of the insulating resin layer 50, and thereby a laminate bonding in a preferable pressurized state can be expected.

In addition, the dendrites 3 may be crushed by applying a further higher pressure to the insulating resin layer 50 using means for pressing similar to the one mentioned above, subsequent to the step of forming the insulating resin layer 50 as mentioned above. Usually, an adhesive that is used for a flexible wiring board has elasticity to some extent, and therefore such a pressing process creates a state in which the internal stress is accumulated. This is useful to reduce the compressional/tensile stress applied to the conductor portion 2 when the printed wiring board 10 is used while it is bent, and thus the bend performance can be further improved.

The method for crushing the dendrites 3 as described above may be performed at the time of application of the adhesive 44, or at the time when the adhesive 44 becomes semi-cured or cured. In a practical operation, a state close to this state is achieved in Embodiments 1 to 3 described above unless bonding is performed with an exceptionally low pressure. For example, in Embodiment 1, this applies to when a certain degree of pressure is applied for temporarily fixing the cover lay material 51a using a means for pressing, such as roller. In addition, in Embodiments 2 and 3, this applies to when the adhesive 42, 431 is applied with application of pressure using a roll coater or the like.

Embodiment 5

Figure 10:
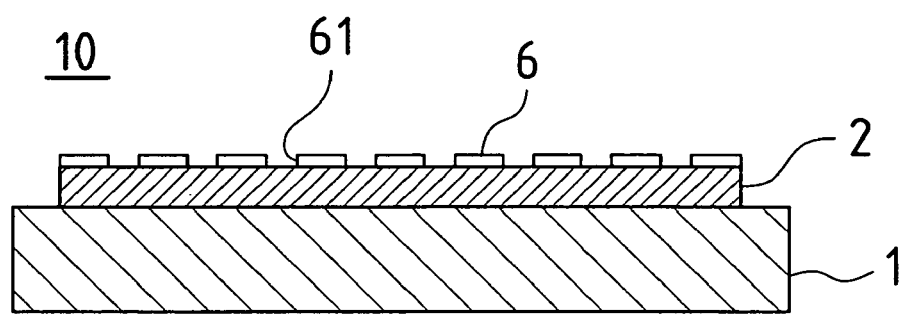
FIG. 10 is a schematic cross-sectional view that shows a process of production in a method for producing a printed wiring board according to Embodiment 5 of the present invention.
Figure 11:
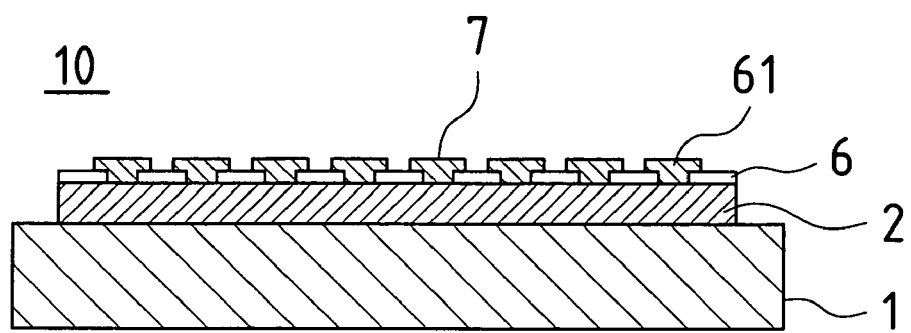
FIG. 11 is a schematic cross-sectional view that shows a process of production according to Embodiment 5 of the present invention.
Figure 12:
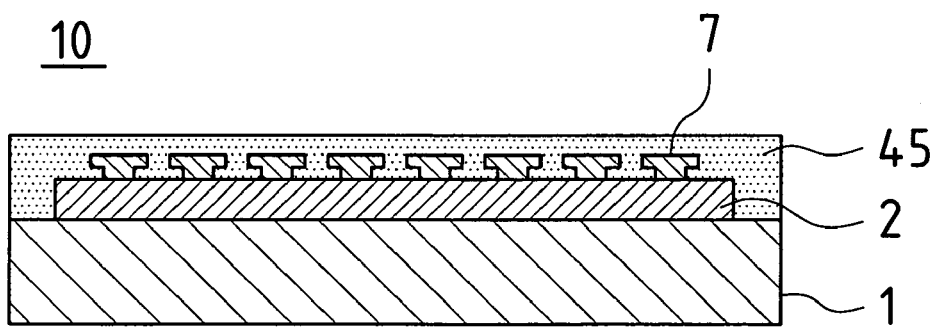
FIG. 12 is a schematic cross-sectional view that shows a process of production according to Embodiment 5 of the present invention.

Hereafter, Embodiment 5 of the present invention will be described. FIGS. 10 to 12 are schematic cross-sectional views that show Embodiment 5 of the present invention.

This embodiment is characterized in that, instead of dendrites, plating metal crystals 7 having an approximately mushroom-shaped cross-section are formed on the surface of a conductor portion 2 as the projecting metal crystals.

First, a plating resist 6 that has numerous minute holes 61 is formed on the surface of the conductor portion 2 that has been subjected to a plating pretreatment.

Subsequently, as shown in FIG. 11, the numerous plating crystals 7 are grown from the minute holes 61 of the plating resist 6 using an electroplating method or a chemical plating method. As shown in FIG. 11, these plating metal crystals 7 grow in such a manner that their cross-sections have a mushroom-like shape with its tip portion thicker than its center portion and base portion. Subsequent to formation of the plating metal crystals 7 in this manner, the plating resist 6 is stripped off from the surface of the conductor portion 2.

As shown in FIG. 12, an adhesive layer 45 is, then, formed so that spaces between the plating metal crystals 7 are completely filled. Subsequently, an insulating resin layer 50 is formed on such an adhesive layer 45 using any one of the methods described in the above mentioned Embodiments 1 to 4.

Incidentally, this embodiment uses an example in which the plating metal crystals 7 having an approximately mushroom-shaped cross-section are formed, but the present invention is not limited to such a shape, and any projecting metal crystals that are grown to have their tip portions thicker than their center portions and base portions are acceptable.

A method for producing a printed wiring board 10 that has such a configuration has an advantage in that it is easier to control and manage a step of forming the plating metal crystals 7 because their tip portions are thicker than their center portions and base portions.

Embodiment 6

Hereafter, Embodiment 6 of the present invention will be described. Features of this embodiment include that an oxidation treatment is performed on the surface of projecting metal crystals after forming the projecting metal crystals, such as dendrites 3 and plating metal crystals 7, but prior to formation of an insulating resin layer 50. The oxidation treatment is performed to the surface using a treatment solution of sodium chlorite, sodium hydroxide, or alkyl acid ester, or the like to form an oxide film as a blackening treatment or browning treatment, which seems to depend on differences in the degree of the mixture of $Cu_2O$ (red) and CuO (black). Subsequent to the above mentioned oxidation treatment, the reduction treatment is performed using, for example, sodium boron hydride and formalin or hydrogen gas generated with zinc powder and sulfuric acid, to reduce to a copper layer that has projections and depressions. Alternatively, the surface may be mechanically polished, by, for example, high pressure jet spraying with a commercially available roughening agent or slurry abrasive.

Thus, the wettability of the projecting metal crystals and the adhesive that is applied and filled thereon can be improved, and the bond property and the contact property can be increased. These processes may be performed prior to formation of the dendrite 3 in addition to such processes as of roughening or polishing of the surface of the conductor portion 2.

The present invention can be embodied and practiced in other different forms without departing from the spirit and essential characteristics thereof. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

What is claimed is:

1. A method for producing a flexible printed wiring board, comprising:
    a step of performing a plating pretreatment to a conductor portion that has been formed on a surface of a flexible wiring board substrate,
    a step of forming numerous projecting metal crystals on the surface of the conductor portion using an electrical or chemical method, and
    a step of forming an insulating resin layer on the surface of the conductor portion that has the projecting metal crystals formed thereon,
    wherein the insulating resin layer is formed by laminate bonding a flexible insulating resin plate to the surface of the conductor portion using an adhesive, the adhesive encasing the projecting metal crystals such that the metal crystals do not contact the flexible insulating resin plate.

2. The method for producing a printed wiring board according to claim 1, wherein the projecting metal crystals are formed in the form of branches or needles.

3. The method for producing a printed wiring board according to claim 2, wherein the projecting metal crystals are dendrites that are formed using an electroplating or chemical plating method.

4. The method for producing a printed wiring board according to claim 1, wherein, in the step of forming the projecting metal crystals, a plating resist that has numerous minute holes is formed on the surface of the conductor portion, and the plating resist is removed after forming the projecting metal crystals that are grown from the minute holes in such a manner that their tip portions become thicker than their center portions and base portions.

5. The method for producing a printed wiring board according to any one of claims 1 to 4, wherein the projecting metal crystals are formed with copper, tin, or nickel.

6. The method for producing a printed wiring board according to claim 1, wherein, prior to the step of forming an insulating resin layer, an oxidation treatment is performed to the surface of the projecting metal crystals.

7. The method for producing a printed wiring board according to claim 1, wherein the insulating resin layer is formed by forming a semi-cured adhesive layer in advance on a surface of an insulating resin plate, stacking the insulating resin plate on the conductor portion and the projecting metal crystals, and then applying pressure and raising temperature for laminate bonding.

8. The method for producing a printed wiring board according to claim 1, wherein the insulating resin layer is formed by applying a liquid adhesive to the surface of the wiring board substrate and filling in gaps between the projecting metal crystals, semi-curing or drying the adhesive, then stacking an insulating resin plate thereon, and then applying pressure and raising temperature for laminate bonding.

9. The method for producing a printed wiring board according to claim 1, wherein the insulating resin layer is formed by applying a liquid adhesive to the surface of the wiring board substrate and filling in gaps between the projecting metal crystals, semi-curing or drying the adhesive, then stacking an insulating resin plate provided with an adhesive layer or a semi-cured insulating resin plate, and then applying pressure and raising temperature for laminate bonding.

10. The method for producing a printed wiring board according to claim 2, wherein, prior to the step of forming an insulation resin layer, the projecting metal crystals in a predetermined amount are crushed by applying pressure using means for pressing.

11. The method for producing a printed wiring board according to claim 3, wherein, prior to the step of forming an insulation resin layer, the projecting metal crystals in a predetermined amount are crushed by applying pressure using means for pressing.

12. The method for producing a printed wiring board according to claim 8, wherein, after applying and filling a liquid adhesive, the projecting metal crystals are crushed using appropriate means for pressing at the time when the adhesive is either in a liquid state, in a semi-cured state, or in a cured state.

13. The method for producing a printed wiring board according to claim 9, wherein, after applying and filling a liquid adhesive, the projecting metal crystals are crushed using appropriate means for pressing at the time when the adhesive is either in a liquid state, in a semi-cured state, or in a cured state.

14. The method for producing a printed wiring board according to claim 10, wherein, after forming the insulating resin layer, the projecting metal crystals are crushed by applying further pressure to the insulating resin layer.

* * * * *